United States Patent
Yuzurihara et al.

(10) Patent No.: US 11,881,777 B2
(45) Date of Patent: Jan. 23, 2024

(54) DC PULSE POWER SUPPLY DEVICE

(71) Applicant: KYOSAN ELECTRIC MFG. CO., LTD., Yokohama (JP)

(72) Inventors: Itsuo Yuzurihara, Yokohama (JP); Toshiyuki Adachi, Yokohama (JP); Tomohiro Yoneyama, Yokohama (JP); Koichi Miyazaki, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 338 days.

(21) Appl. No.: 17/422,469

(22) PCT Filed: Nov. 8, 2019

(86) PCT No.: PCT/JP2019/043836
§ 371 (c)(1),
(2) Date: Jul. 13, 2021

(87) PCT Pub. No.: WO2020/152947
PCT Pub. Date: Jul. 30, 2020

(65) Prior Publication Data
US 2022/0094266 A1 Mar. 24, 2022

(30) Foreign Application Priority Data
Jan. 24, 2019 (JP) .................. 2019-010637

(51) Int. Cl.
*H02M 3/156* (2006.01)
*H02M 3/158* (2006.01)
(Continued)

(52) U.S. Cl.
CPC ............. *H02M 3/158* (2013.01); *H02M 1/34* (2013.01); *H02M 3/33507* (2013.01); *H02M 7/5387* (2013.01)

(58) Field of Classification Search
CPC ...... H02M 3/156; H02M 3/1566; H02M 1/34; H02M 7/21; H02M 7/217
See application file for complete search history.

(56) References Cited

U.S. PATENT DOCUMENTS

| | | | |
|---|---|---|---|
| 4,395,675 A | 7/1983 | Toumani | |
| 5,929,614 A * | 7/1999 | Copple | ................. H02M 3/155 323/222 |

(Continued)

FOREIGN PATENT DOCUMENTS

| | | |
|---|---|---|
| EP | 0969587 A2 | 1/2000 |
| JP | 58-079470 A | 5/1983 |

(Continued)

OTHER PUBLICATIONS

Extended European Search Report dated Aug. 31, 2022, issued in counterpart EP Application No. 19911240.0. (10 pages).

(Continued)

*Primary Examiner* — Gary L Laxton
(74) *Attorney, Agent, or Firm* — WHDA, LLP

(57) ABSTRACT

This DC-pulse power supply device is provided with: a DC power supply; a pulse unit (20) for generating a pulse output using a step-up chopper circuit connected to the DC power supply; and a voltage superimposing unit (30A, 30B) connected to a DC reactor of the step-up chopper circuit. The voltage superimposing unit (30A, 30B) superimposes an amount (Vc, VDCL2) corresponding to a superimposed voltage on the output voltage of the step-up chopper circuit. The pulse unit (20) outputs, in a pulse form, the output voltage (Vo) on which the amount (Vc, VDCL2) corresponding to the superimposed voltage is superimposed by the voltage superimposing unit (30A, 30B). The amount corresponding to the superimposed voltage is superimposed on the pulse output of the step-up chopper circuit, thereby (Continued)

raising the output voltage of the pulse output of the step-up chopper circuit.

11 Claims, 9 Drawing Sheets

(51) Int. Cl.
*H02M 1/34* (2007.01)
*H02M 3/335* (2006.01)
*H02M 7/5387* (2007.01)

(56) References Cited

U.S. PATENT DOCUMENTS

| | | | |
|---|---|---|---|
| 5,982,646 | A | 11/1999 | Lyons et al. |
| 6,043,636 | A | 3/2000 | Gaudreau et al. |
| 6,380,722 | B2 * | 4/2002 | Wickersham ......... H02M 3/155 361/18 |
| 6,822,427 | B2 | 11/2004 | Wittenbreder |
| 7,023,186 | B2 | 4/2006 | Yan |
| 9,780,642 | B2 | 10/2017 | Skinner et al. |
| 9,780,676 | B2 | 10/2017 | Kolar et al. |
| 2007/0053217 | A1 | 3/2007 | Darroman |
| 2015/0085534 | A1 | 3/2015 | Abramovitz et al. |
| 2017/0244330 | A1 | 8/2017 | Kolar et al. |

FOREIGN PATENT DOCUMENTS

| | | |
|---|---|---|
| JP | 1-252165 A | 10/1989 |
| JP | 5-327089 A | 12/1993 |
| JP | 8-222258 A | 8/1996 |
| JP | 2002-218743 A | 8/2002 |
| JP | 2004-080880 A | 3/2004 |
| JP | 2006-6053 A | 1/2006 |
| JP | 2012-178952 A | 9/2012 |
| JP | 2012-196080 A | 10/2012 |

OTHER PUBLICATIONS

Lu, Dylan Dah-Chuan et al.: "A single-switch continuous-conduction-mode boost converter with reduced reverse-recovery and switching losses", IEEE Transactions on Industrial Electronics, IEEE Service Center, Piscataway, NJ, USA, vol. 50, No. 4, Aug. 1, 2003 (Aug. 1, 2003), pp. 767-776, XP011098992; Cited in Extended European Search Report dated Aug. 31, 2022. (10 pages).

Perez Ma et al: The Forward Discharge Converter (FDC): A General Solution to Obtain Soft-Swtiching in Any Power Converter, Proceedings of the Annual Power Electronics Specialists Conference (PESC). Toledo, Jun. 29-Jul. 3, 1992; [Proceedings of the Annual Power Electronics Specialists Conference (PESC)], New York, IEEE, US, vol. 1, Jun. 29, 1992 (Jun. 29, 1992), pp. 101-108, XP000369022; Cited in Extended European Search Report dated Aug. 31, 2022. (9 Pages).

John Mankowski et al: "A Review of Short Pulse Generator Technology", IEEE Transactions on Plasma Science, IEEE Service Center, Piscataway, NJ, US, vol. 28, No. 1, Feb. 1, 2000 (Feb. 1, 2000), XP011045459; Cited in Extended European Search Report dated Aug. 31, 2022. (7 pages).

Office Action dated Dec. 14, 2021, issued in counterpart JP Application No. 2019-010637, with English translation. (6 pages).

Office Action dated May 26, 2023, issued in counterpart to KR Application No. 10-2021-7021135, with English Translation. (11 pages).

N. Vazquez et al., "The Tapped-Inductor Boost Converter", Nov. 5, 2007, IEEE, International Symposium on Industrial Electronics; Cited in KR Office Action dated May 26, 2023.

International Search Report dated Dec. 17, 2019, issued in counterpart application No. PCT/JP2019/043836 (2 pages).

Office Action dated Feb. 22, 2022, issued in counterpart JP Application No. 2019-010637, with English Translation. (5 pages).

Decision to Grand Patent dated Mar. 29, 2022, issued in counterpart JP Application No. 2019-010637, with English Translation. (5 pages).

Office Action dated Jan. 31, 2023, issued in counterpart TW Application No. 109100284, with English Translation. (15 pages).

* cited by examiner

US 11,881,777 B2

DC PULSE POWER SUPPLY DEVICE

TECHNICAL FIELD

The present invention relates to a DC pulse power supply device that supplies a pulse output to a load.

BACKGROUND ART

A pulse output from a DC pulse power supply device is a high-frequency output that continuously turns on and off a DC voltage in a range of several Hz to hundreds kHz.

The DC pulse power supply device is used for supplying the pulse output to a load of a plasma generation device, an exciting of a pulse laser, an electrical discharge machine or similar. In the case of using the DC power supply device as plasma generation device, the pulse output is supplied between electrodes in a plasma generating chamber, so as to ignite plasma generated by the electrical discharge occurring between the electrodes and keep the generated plasma.

FIG. 9(a) shows a configuration example of the DC pulse power supply device. It is known that a DC pulse power supply device has a step-up chopper circuit as a circuit for generating a pulse form. A DC pulse power supply device 100 consists of a DC power supply 110 and a step-up chopper circuit 120, the DC power supply 110 supplying to a load 130 with a pulse output obtained by boosting a DC voltage by the step-up chopper circuit 120 (see Patent Literatures 1 and 2).

FIG. 9(b) illustrates a configuration example of the step-up chopper circuit (see Patent Literature 3). The step-up chopper circuit 120 is configured by connecting an inductor 121 in series between the DC power supply and the load while connecting a switching element 122 in parallel to the load, so as to form a pulse output that is boosted in accordance with a duty ratio between an ON period and an OFF period of the switching element 122. In the above ON/OFF operation, energy is accumulated in a DC reactor of the inductor 121 depending on a time width of the ON period, thereby forming a pulse output with amplitude boosted according to the accumulated energy.

The amplitude of the pulse output to be boosted is defined depending on the duty ratio between the ON period and OFF period of the switching element, and the amplitude may exceed the defined amplitude due to vibration or others created during the OFF period of the switching element 122.

There is a known configuration for a step-up chopper circuit consisting of a series circuit comprising a reactor and switching elements, in which a series circuit consisting of a reactor Lr, a diode D1 and a capacitor C1 is connected to both ends of a switching element Q1, and a series circuit, consisting of a switching element Q2 and a capacitor C2, composing an active-clamp circuit is connected to both ends of the reactor Lr, thereby allowing the active-clamp circuit to conduct zero-voltage switching (ZVS) on the switching element Q1 of the step-up chopper circuit (see Patent Literature 4).

Furthermore, in the configuration taught in Patent Literature 4, the switching elements Q1, Q2 are applied with a voltage obtained by adding a charge voltage in the capacitor C2 of the active-clamp circuit to an output voltage Vo. In this case, in order to avoid the applied voltage from exceeding a withstand voltage of the switching elements Q1, Q2, the reactor of the step-up chopper circuit is composed of two reactors magnetically coupled to each other, namely a first reactor L1-1 and a second reactor L1-2, so that the capacitor C2 of the active-clamp circuit is discharged due to energy accumulated in the second reactor L1-2.

CITATION LIST

Patent Literature

[Patent Literature 1] Japanese Patent Laid-Open Publication No. 222258/1996 (FIG. 1, Paragraph 0012)
[Patent Literature 2] Japanese Patent Laid-Open Publication No. 2006-6053 (FIG. 1)
[Patent Literature 3] Japanese Patent Laid-Open Publication No. 252165/1989 (FIG. 1)
[Patent Literature 4] Japanese Patent Laid-Open Publication No. 2012-178952 (FIGS. 1 and 9)

SUMMARY OF INVENTION

Problems to be Solved by the Invention

In the case where a pulse output from the DC pulse power supply device is supplied between electrodes in the plasma generation chamber and plasma produced by the discharge between the electrodes is ignited, the higher output voltage of the pulse output is, more advantageous in ignitability.

Since The amplitude of the pulse output of the step-up chopper circuit is defined depending on the duty ratio between the ON period and OFF period of the switching element, it is necessary to increase the duty ratio for boosting the output voltage of the pulse output, and it is necessary to decrease the time width of the OFF period to achieve a higher duty ratio.

In the configuration using the active-clamp circuit in Patent Literature 4, since a charge voltage in the capacitor of the active-clamp circuit is applied to the switching element, it does not contribute to a high output voltage, and thereby the output voltage of the pulse output is not boosted.

It is an object of the present invention to solve the above-described problem, and accomplish the increase in the output voltage of the pulse output in the step-up chopper circuit.

Means for Solving the Problem

The DC pulse power supply device of the present invention superimposes a regeneration voltage and/or a reactor voltage on the pulse output in the step-up chopper circuit to thereby increase the output voltage of the pulse output in the step-up chopper circuit.

The DC pulse power supply device of the invention comprises a DC power supply, a pulsing unit that generates a pulse output by using a step-up chopper circuit connected to the DC power supply, and a voltage superimposing unit connected to the DC reactor of the step-up chopper circuit. The voltage superimposing unit superimposes a superimposed voltage on the output voltage of the step-up chopper circuit so that the output voltage is boosted. The pulsing unit outputs the output voltage as pulse output that includes the superimposed voltage which is superimposed by the voltage superimposing unit.

The voltage superimposing unit has a plurality of forms. The voltage superimposing unit in a first form is a regeneration voltage unit, and the voltage superimposing unit in a second form is a reactor voltage unit.

The voltage superimposing unit in the first form can be configured by using a regeneration unit. The regeneration unit clamps the output voltage in the step-up chopper circuit to a set voltage, then superimposes a regeneration voltage of the clamped voltage as superimposed voltage on a voltage in the DC reactor of the step-up chopper circuit, and regenerates a voltage that exceeds the set voltage to the DC power source.

The reactor voltage unit in the second form superimposes as superimposed voltage a reactor voltage of an inductive voltage induced in the second DC reactor due to magnetic coupling with the DC reactor consisting the step-up chopper circuit.

The DC power supply device of the invention can be configured to have, as voltage superimposing unit, the regeneration voltage unit in the first form, the rector voltage unit in the second form, and two voltage superimposing unit in the third form that consists of the regeneration voltage unit in the first form and the reactor voltage unit in the second form.

FIG. 1 illustrates a schematic configurations of the pulsing unit and the voltage superimposing unit included in the DC pulse power supply device of the present invention, in which FIG. 1(a) shows a configuration including the regeneration voltage unit as the first form of the voltage superimposing unit, FIG. 1(b) shows a configuration including the reactor voltage unit as the second form of the voltage superimposing unit, and FIG. 1(c) shows a configuration including the regeneration voltage unit and the reactor voltage unit as the third form of the voltage superimposing unit.

First Form

In FIG. 1(a) a pulsing unit 20 comprises a step-up chopper circuit composed of a series circuit comprising a DC reactor 21 and a switching element 22, and further comprises as the voltage superimposing unit in the first form a regeneration voltage unit 30A for superimposing a regeneration voltage on an output voltage of an pulse output in the pulsing unit 20. The regeneration voltage unit 30A is connected in parallel between both ends of the DC reactor 21, so that a reactor voltage VDCL of the DC reactor 21 is applied to a capacitor voltage Vc. An output voltage Vo of the pulse output in the pulsing unit 20 becomes a voltage obtained by superimposing the capacitor voltage Vc on a DC voltage VAB in the DC power supply, namely (VAB+Vc).

The regeneration voltage unit 30A can be configured by connecting the regeneration unit in parallel between both ends of the DC reactor 21 of the step-up chopper circuit. The regeneration unit regenerates to the DC power supply a portion of the reactor voltage in the DC reactor 21 that exceeds a set voltage. The regeneration unit forms a clamp circuit that clamps a charge voltage in a capacitor connected in parallel between both ends of the DC reactor, and also regenerates a voltage exceeding a clamped voltage to the DC power supply. The regeneration voltage unit 30A superimposes a regeneration voltage of the set voltage which is the clamped voltage in the regeneration unit as a superimposed voltage on the output voltage of the pulse output.

In the first form, as shown in FIG. 1(a), a source S of the switching element 22 of the step-up chopper circuit is connected to the end of a load of the DC reactor 21. In this form, entire reactor voltage of the DC reactor 21 is input to the regeneration voltage unit 30A, so as to perform the regeneration operation based on a comparison with the set voltage in the regeneration voltage unit 30.

Second Form

In FIG. 1(b), the pulsing unit 20 comprises a step-up chopper circuit composed of a series circuit comprising a DC reactor 21a and the switching element 22, and further comprises the reactor voltage unit 30B in the second form for superimposing a reactor voltage as superimposed voltage on an output voltage of a pulse output in the pulsing unit 20.

The reactor voltage unit 30B comprises a second DC reactor 21b that is magnetically coupled to the DC reactor 21a and connected to an output end of the DC reactor 21a, and a voltage induced in the second DC reactor 21b due to the magnetic coupling with the DC reactor 21a is applied to the output voltage of the pulse output, in which voltage a reactor voltage VDCL2 is the superimposed voltage. An output voltage Vo of the pulse output in the pulsing unit 20 becomes a voltage obtained by superimposing a first DC reactor voltage VDCL1 and a second DC reactor voltage VDCL2 on a DC voltage VAB in the DC power supply, namely (VAB+VDCL1+VDCL2).

In the second form, as shown in FIG. 1(b), a series circuit is composed of the DC reactor 21a and the second DC reactor 21b magnetically coupled to each other, and the source S of the switching element 22 of the step-up chopper circuit is connected to a tap of the series circuit composed of the DC reactor 21a and the second DC reactor 21b.

Third Form

In FIG. 1(c), the pulsing unit 20 comprises a step-up chopper circuit composed of a series circuit comprising the DC reactor 21a and the switching element 22, and further comprises the regeneration voltage unit 30A in the first form for superimposing a regeneration voltage on an output voltage of a pulse output in the pulsing unit 20, and the reactor voltage unit 30B in the second form for superimposing a reactor voltage on the output voltage of the pulse output in the pulsing unit 20.

The regeneration voltage unit 30A is connected in parallel between both ends of the DC reactor 21a, so as to apply the reactor voltage VCDL1 in the DC reactor 21a to the capacitor voltage Vc. The reactor voltage unit 30B is magnetically coupled with the DC reactor 21a and comprises the second DC reactor 21b connected to an output end of the DC reactor 21a, so that a reactor voltage VDCL2 induced in the second DC reactor 21b due to the magnetic coupling with the DC reactor 21a is applied as superimposed voltage to the output voltage of the pulse output.

An output voltage Vo of the pulse output in the pulsing unit 20 becomes a voltage (VAB+Vc) in such a way that the capacitor voltage Vc is superimposed on a DC voltage VAB in the DC power supply by the regeneration voltage unit 30A in the first firm, and then becomes a voltage (VAB+Vc+VDCL2) in such a way that the reactor voltage VDCL2 is superimposed on the DC voltage VAB in the DC power supply by the reactor voltage unit 30B in the second form.

(Pulsing Unit)

The pulsing unit 20 comprises a step-up chopper circuit consisting of the DC reactor 21a connected in series between the DC power supply and a load, and a switching element 22 connected in parallel to the load. The regeneration voltage unit 30A composing the voltage superimposing unit 30 is for inputting a reactor voltage VDCL of the DC reactor 21a to regenerate an excessive voltage component (VDCL−Vin) that exceeds a regeneration input voltage Vin, which is a set voltage, to the DC power supply. The regeneration input voltage Vin corresponds to the capacitor voltage Vc. In FIG. 1, terminals on the DC power supply side are expressed as A and B.

In the pulsing unit 20, accumulated energy is accumulated in the DC reactor 21a during an ON operation of the step-up chopper circuit, and the accumulated energy causes the generation of a reactor voltage in the DC reactor 21a during an OFF operation. The ON and OFF operations of the step-up chopper circuit is repeated to boost the reactor voltage.

(Regeneration Voltage Unit)

The regeneration voltage unit 30A does not regenerate a voltage when the reactor voltage VDCL does not exceed the set voltage, and when the voltage VDCL exceeds the set voltage, regenerates a component of the voltage exceeding the set voltage to the DC power supply. Thus, the voltage boosted in the step-up chopper circuit is clamped to the set voltage, thereby preventing the generation of the excessive voltage.

The set voltage is defined by the regeneration input voltage Vin in the regeneration voltage unit 30A. When the reactor voltage VDCL1 in the DC reactor 21a does not exceed the regeneration input voltage Vin in the regeneration voltage unit 30A, the regeneration voltage unit 30A does not conduct the regeneration, and when the reactor voltage VDCL1 exceeds the regeneration input voltage Vin in the regeneration voltage unit 30A, the unit 30A regenerates an exceeded component (VDCL1−Vin) to the DC power supply. The regeneration input voltage Vin in the regeneration voltage unit 30A, which is the set voltage for defining a regeneration operation, can be set on the basis of a DC voltage VAB of the DC power supply as well as the circuitry of the regeneration voltage unit 30A.

According to a configuration example, the regeneration voltage unit 30A comprises a capacitor connected in parallel with respect to the reactor voltage of the pulsing unit 20, an invertor circuit that performs orthogonal transformation on a capacitor voltage across the capacitor, a transformer that transforms an AC voltage in the invertor circuit, and a rectifier that rectifies an AC voltage of the transformer, the rectifier having its output end connected to the DC power supply.

A transformer ratio of the transformer defines a voltage ratio between the voltage across the capacitor and the voltage of the DC power supply. Since the capacitor voltage in the regeneration voltage unit 30A is defined depending on the voltage of the DC power supply and the transformer ratio of the transformer, the regeneration voltage unit 30A utilizes the capacitor voltage as set voltage of the regeneration input voltage Vin to perform start and stop of the regeneration operation. The set voltage is dependent on the voltage of the DC power supply and the transformer ratio of the transformer, thereby enabling to vary the transformer ratio of the transformer to change the set voltage. The change in the set voltage can change the clamp voltage in the step-up chopper circuit while changing an operating voltage of the regeneration operation.

The capacitor voltage can be defined by controlling the output of the inverter circuit, in addition to changing the transformer ratio of the transformer included in the regeneration voltage unit 30A. As to a solution of output control of the inverter circuit, there are PWM control and phase-shift control, for instance. However, the solution is not limited to the above and any solutions that is for controlling the inverter circuit can be employed.

In the step-up chopper circuit, the DC reactor 21a is connected between the DC power supply and a source S of the switching element 22 of the step-up chopper circuit. The source S of the switching element 22 of the step-up chopper circuit is connected to a load-side end of the DC reactor 21a or a tap of the DC reactor 21.

(Form of DC Reactor)

The DC reactor 21a and the second DC reactor 21b may be in the form of single-winding coil or multi-winding coil. In the single-winding form, two DC reactors magnetically coupled to each other can be composed of a non-tapped autotransformer or a tapped transformer. In the multi-winding form, two DC reactors magnetically coupled can be composed of a multi-winding transformer.

Effects of the Invention

As described above, in accordance with the present invention, the DC pulse power supply device can increase the output voltage of the pulse output in the step-up chopper circuit.

BEST MODE FOR CARRYING OUT THE INVENTION

Figure 1:
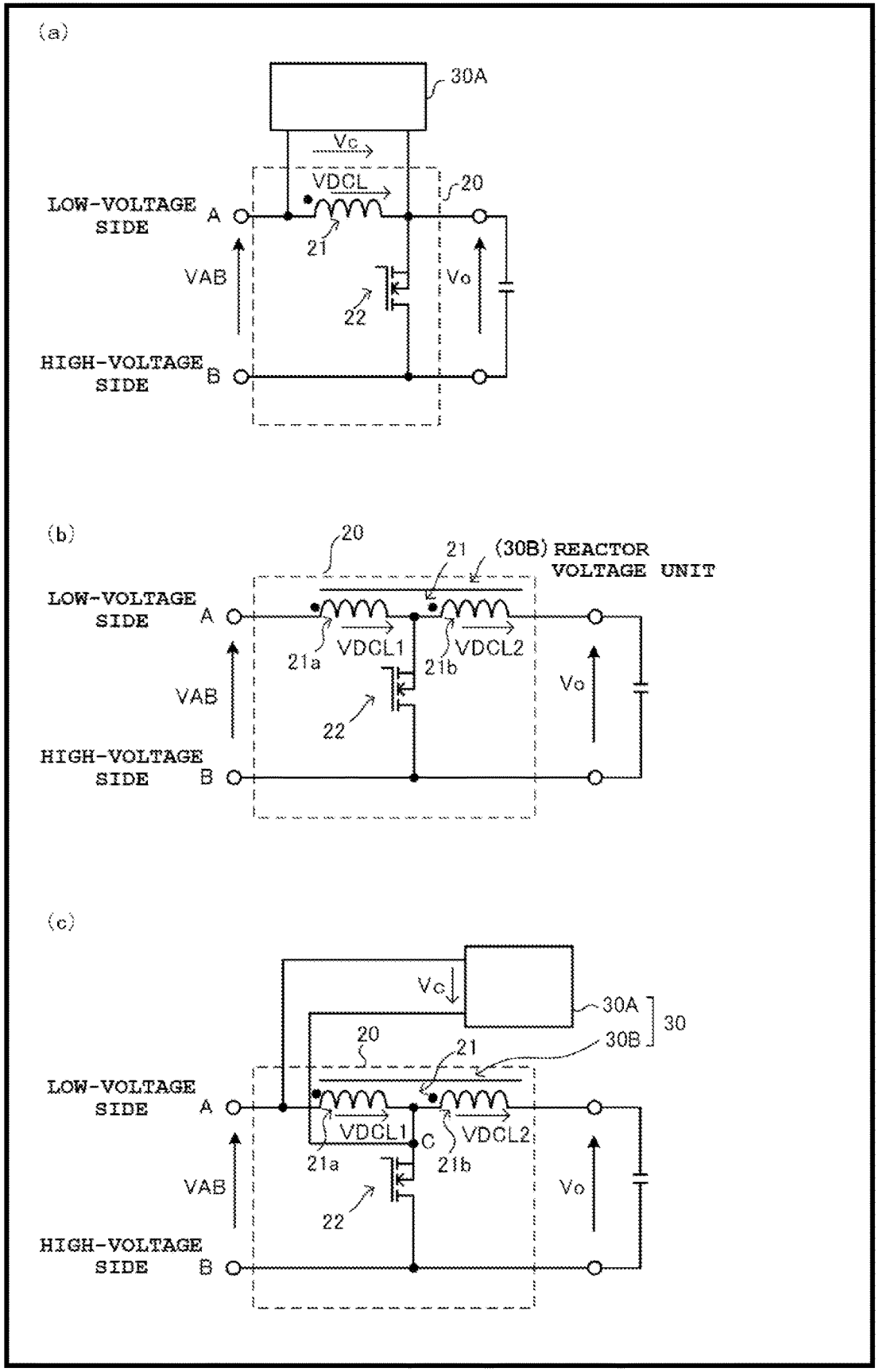
FIG. 1 illustrates a configuration example of a step-up chopper circuit and a voltage superimposing unit (regeneration voltage unit, reactor voltage unit) of a DC pulse power supply device according to the invention.

A DC pulse power supply device of the present invention superimposes a regeneration voltage and/or a reactor voltage as a voltage for boosting on a pulse output in the step-up chopper circuit to thereby increase an output voltage of the pulse output in the step-up chopper circuit.

Now, a description will be made on the DC pulse power supply device of the invention by referring to first to fourth configuration examples and FIGS. 2 to 8.

The first configuration example connects a regeneration voltage unit to both ends of a DC reactor of a step-up chopper circuit, the second configuration example uses a second DC reactor magnetically coupled with the DC reactor of the step-up chopper circuit as a reactor voltage unit, and the third and fourth configuration examples comprise the regeneration voltage unit connected to both ends of the DC reactor of the step-up chopper circuit and the reactor voltage unit comprising the second DC reactor magnetically coupled with the DC reactor of the step-up chopper circuit. The second and third configuration examples have two DC reactors magnetically coupled to each other as a tapped autotransformer, and the fourth configuration example has two DC reactors magnetically coupled to each other as a multi-winding transformer. Furthermore, as to a reactor voltage to be regenerated, the first to fourth configuration examples use a voltage on a low-voltage side of the DC power supply as a reference voltage.

(First Configuration Example of DC Pulse Power Supply Device)

A description will be made about the first configuration example of the DC pulse power supply device of the invention and a state of the voltage by referring to FIGS. 2, 3 and 4.

The DC pulse power supply device of the invention comprises a DC power supply unit (DC unit) 10, a pulsing unit 20A that supplies to a load 4 with a pulse output generated by the step-up chopper circuit connected to the DC power supply unit 10, a regeneration unit 40 that regenerates an excessively-risen component of a voltage produced in the pulsing unit 20A, and a control circuit 50 that controls the DC power supply unit 10, the pulsing unit 20A and the regeneration unit 40, in which device the pulse output is supplied to the load 4 through an output cable 3. FIG. 2 shows an example for using a plasma generation device as the load 4 but the load 4 is not limited thereto, and thus an excitation of a pulse laser, electrical discharge machine or similar may be employed. The regeneration unit 40 included in a DC pulse power supply device 1 of the first configuration example forms a regeneration voltage unit 30A, and thus regenerates the excessively-risen component in the pulsing unit 20A to the DC power supply 10.

(DC Power Supply)

The DC power supply unit (DC unit) 10 comprises a rectifier 11 that rectifies an AC voltage of an AC power supply 2 into a DC voltage, a snubber circuit 12 that absorbs and suppresses a high voltage spike transiently generated during rectification, a single-phase inverter circuit 13 that changes the DC voltage into an AC voltage, a single-phase transformer 14 that transforms the AC voltage in the single-phase inverter circuit 13 to a prescribed voltage value, a rectifier 11 that rectifies the AC voltage transformed by the single-phase transformer 14 to a DC voltage, and a capacitor (CF) 16 that stores a both-end voltage of which is as a DC voltage of the DC power supply unit. One end of the capacitor 16 is grounded, and a negative low-voltage is produced at the other end thereof. The configuration in FIG. 2 shows a capacitive load of the plasma generation device as an example of the load 4. In this configuration, as one end of the plasma generation device is grounded to supply the negative voltage, the DC power supply unit 10 is configured to generate a puled output of the negative voltage.

The single-phase inverter 13 performs a switching operation in response to a control signal sent from the control circuit 50, so as to change the DC voltage into an AC voltage with a predefined frequency. Each circuit element of the rectifiers 11, 15, the snubber circuit 12, the single-phase inverter 13 and the single-phase transformer 14, which compose the DC power supply unit 10, may be any circuitry that is commonly known.

(Pulsing Unit)

The pulsing unit 20A creates a pulse waveform from the DC voltage by the step-up chopper circuit. The step-up chopper circuit comprises a DC reactor 21A connected in series between the DC power supply and the load, a switching element (Q1) 22 connected in parallel to the load, and a drive circuit 23 for controlling an ON/OFF operation of the switching element 22. The DC reactor 21A consists of a DC reactor 21a that is composed of a non-tapped autotransformer. The pulsing unit 20A is provided on its DC power supply side with a grounded terminal B and a terminal A of negative voltage as low-voltage side. The illustrated switching element 22 is an example of FET, in which the source S is connected to the low-voltage side and a drain D is connected to a grounded-voltage side, and inputting a drive signal from the drive circuit 23 to a gate G.

The control circuit 50 produces a signal for setting a time width or duty ratio between an ON period and an OFF period of the switching element 22 with respect to a target pulse output in order to activate the step-up chopper circuit, as well as producing a control signal based on a voltage and current at the output end of the DC power supply unit 10.

The drive circuit 23 outputs the drive signal based on the control signal from the control circuit 50 to the gate G of the switching element 22, so as to making the switching element 22 to perform the ON/OFF operation.

The source S of the switching element 22 is connected to the load of the DC reactor 21a, and the drain D of the switching element 22 is grounded. When the switching element 22 is in the ON state, the load side of the DC reactor 21a is grounded, and thereby a current flows from the terminal B to the terminal A through the switching element 22 in the ON state and the DC reactor 21a. At this time, electromagnetic energy is accumulated in the DC reactor 21a. Then, when the switching element 22 is turned from the ON state to the OFF state, a reactor voltage VDCL is generated in the DC reactor 21a by the accumulated energy in the DC reactor 21a. By repeating the ON and OFF operation of the switching element 22, the step-up chopper circuit can boost an output voltage Vo according to the duty ratio between the ON and OFF periods.

(Regeneration Unit)

The first configuration example of the DC pulse power supply device of the present invention comprises the regeneration voltage unit 30A as a voltage superimposing unit 30. FIG. 2 shows a configuration example comprising the regeneration unit 40 as the regeneration voltage unit 30A.

The regeneration unit 40 regenerates to the DC power supply a component of the reactor voltage in the DC reactor of the step-up chopper circuit that exceeds the set voltage. The regeneration unit 40 comprises a diode 41, a capacitor (C1) 42, an inverter circuit 43, a transformer 44 and a rectifier 45.

One end of the capacitor (C1) 32 is connected to an end of the load of the DC reactor 21a, and the other end is connected to an end of the DC power supply of the DC reactor 21a via the diode 41, so that the reactor voltage generated in the DC reactor 21a is applied. A capacitor voltage VC1 of the capacitor (C1) 42 is defined on the basis of a DC voltage VAB of the DC power supply and a transformer ratio of the transformer, and when the transformer ratio of the transformer 44 is (n2:n1), the set voltage is VC1=(n2/n1)×VAB. The diode 41 is connected in such a way that a direction from the pulsing unit 20A toward the capacitor (C1) 42 of the regeneration unit 40 is to be a forward direction, and when the reactor voltage VDCL of the DC reactor 21a exceeds the capacitor voltage VC1 of the capacitor (C1) 42, the regeneration unit 40 regenerates a component of the reactor voltage VDCL that exceeds the capacitor voltage VC1 of the capacitor (C1) 42.

Thus, the regeneration unit 40 performs the regeneration operation by using the capacitor voltage VC1 of the capacitor (C1) 42 as threshold, and works as constant voltage source for applying a reactor voltage VDCL1 in the DC reactor 21a to the capacitor voltage VC1 during pulse outputting.

An output voltage Vo of the pulse output becomes a voltage (VAB+VC1) that is obtained by superimposing the capacitor voltage VC1 on the DC voltage VAB in the DC power supply. In here, the capacitor voltage VC1 corresponds to the regeneration input voltage Vin in FIG. 1.

Since the capacitor voltage VC1 is set to (n2/n1)×VAB, the output voltage Vo of the pulse output becomes to a voltage (VAB+(n2/n1)×VAB), which is obtained by superimposing the voltage (n2/n1)×VAB on the DC voltage VAB in the DC power supply. The voltage value (n2/n1)×VAB of the capacitor voltage VC1 can be changed by varying the transformer ratio (n2:n1) of the transformer 44, and the output voltage Vo of the pulse output can be boosted by varying the transformer ratio (n2:n1) of the transformer 44.

The capacitor voltage VC1 can be set by controlling an output of the inverter circuit 43, as well as changing the transformer ratio of the transformer 44 included in the regeneration unit 40. In regard of output control of the inverter circuit 43, for example, there are PWM control and phase-shift control. However, the output control of the inverter circuit is not limited to the above, and any solutions that can control the inverter circuit may be employed.

Figure 2:
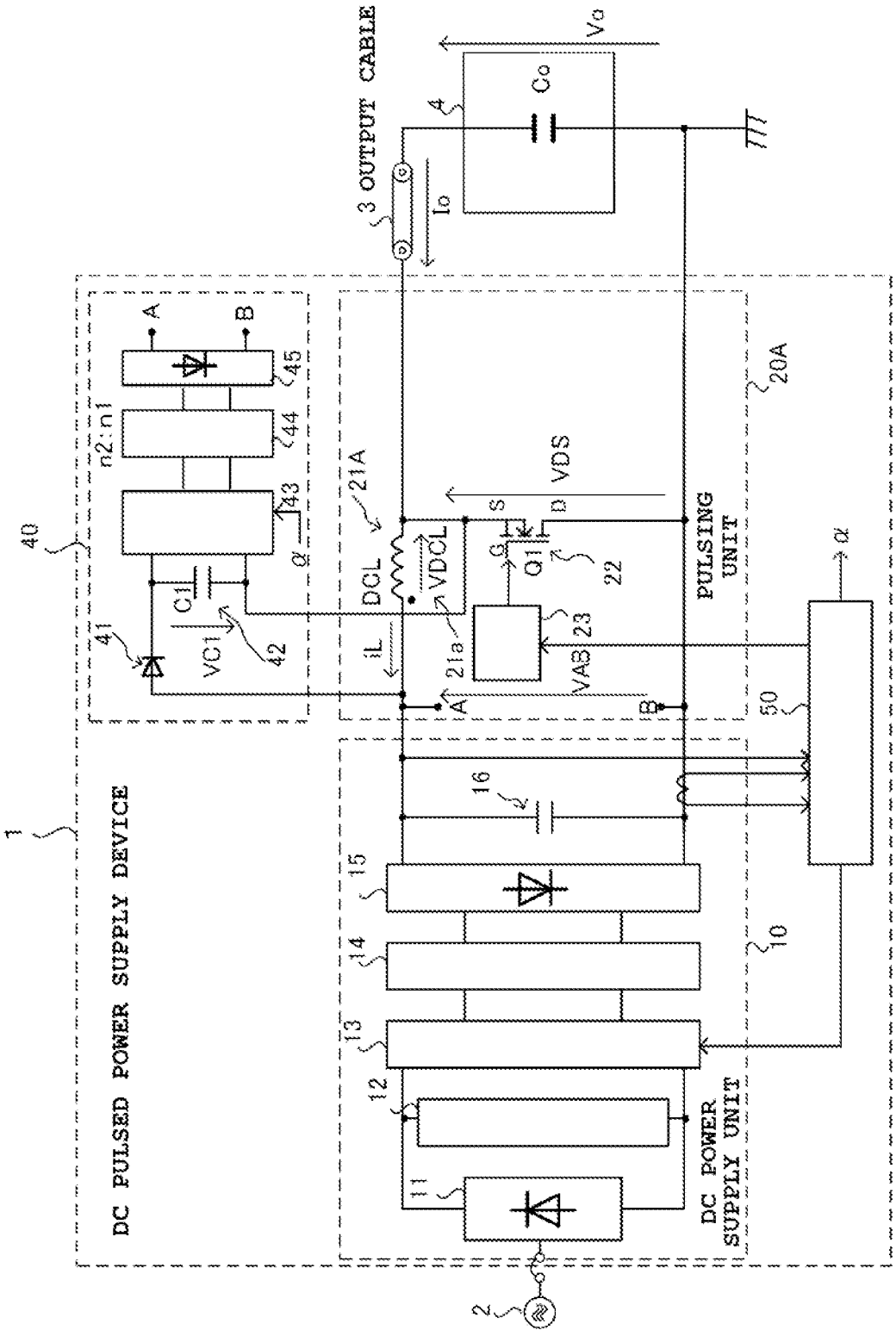
FIG. 2 illustrates a first configuration example of the DC pulse power supply device according to the invention.

Furthermore, in the circuitry shown in FIG. 2, the regeneration unit 40 is configured such that one end of the regeneration unit is connected to a low-voltage input end of the pulsing unit 20A, so as to regenerate the reactor voltage VDCL of the DC reactor 21a as the regeneration input voltage Vin based on a voltage on the low-voltage side (negative voltage).

The inverter circuit 43 performs orthogonal transform between the DC voltage in the capacitor 42 and the AC voltage in the transformer 44 and holds the capacitor voltage VC1 of the capacitor (C1) 42 to a constant voltage level based on the DC voltage VAB of the DC power supply, and when the reactor voltage VDCL exceeds the capacitor voltage VC1 of the capacitor (C1) 42, changes the exceeded voltage component into an AC voltage to regenerate it to the DC power supply. Since the capacitor voltage VC1 is held to the constant voltage level, the reactor voltage VDCL in the DC reactor 21a is clamped to the capacitor voltage VC1. The inverter circuit 43 can be configured with a bridge circuit of the switching element, by way of example. The switching element is open and closed by the control in response to a control signal a from the control circuit 50.

The transformer 44 modulates a voltage ratio between the DC voltage VAB of the DC power supply unit 10 and the capacitor voltage VC1 of the capacitor (C1) 42 based on the transformer ratio. When the transformer ratio of the transformer 44 is (n2:n1), the relationship of the voltages between the DC voltage VAB and the capacitor voltage VC1 can be expressed by VC1=(n2/n1)×VAB.

The rectifier 45 rectifies the AC voltage in the transformer 44 to the DC voltage in the DC power supply unit 10. The terminal on the DC side of the rectifier 45 is connected to the terminals A, B of the DC power supply unit 10, so that electric power is regenerated to the DC power supply unit 10 during the regeneration, whereas the capacitor voltage VC1 in the capacitor (C1) 42 is held constant based on the DC voltage VAB when the regeneration is not performed.

The configuration of the regeneration unit 40 is not limited to the above-described one if the configuration includes a function of clamping the voltage across the DC reactor 21a to a predefined voltage thereby to output a constant voltage and a function of regenerating a component of electric power exceeding the predefined voltage to the DC power supply.

(States of Voltage in DC Pulse Power Supply Unit) The states of the voltage of the DC pulse power supply device will be described by referring to FIGS. 3 and 4. In FIG. 3, FIG. 3(a) shows an ON state and an OFF state of the switching element 22, FIG. 3(b) shows the reactor voltage VDCL of the DC reactor 21a, FIG. 3(c) shows a drain-source voltage VDS of the switching element 22, and FIG. 3(d) shows the output voltage Vo.

In the following, referential numerals S1 to S14 represent the ON state and the OFF state in each phase. The odd numerals S1, S3 . . . S13 represent the ON state of the switching element 22, and the even numerals S2, S4 . . . S14 represent the OFF state of the switching element 22.

(i) ON State (S1, S3 . . . S13)

The switching element 22 is in the ON state (FIG. 3(a)), in which state the terminal on the negative side of the DC reactor 21a is grounded, so that the drain-source voltage VDS in the switching element 22 stands at zero (FIG. 3(c)) and the reactor voltage VDCL in the DC reactor 21a becomes the DC voltage VAB of the DC power supply (FIG. 3(c)). Furthermore, the output voltage Vo includes a component corresponding to the drain-source voltage VDS (FIG. 3(d)).

(ii) OFF State (S2, S4 . . . S14)

Concerning the OFF state, a description will be made about the reactor voltage VDCL in a state before reaching the capacitor voltage VC1 as a threshold for regeneration (S2, S4, S6) and a state after reaching the capacitor voltage VC1 (S8, S10, S12, S14).

(ii-1) States of S2, S4, S6

Figure 3:
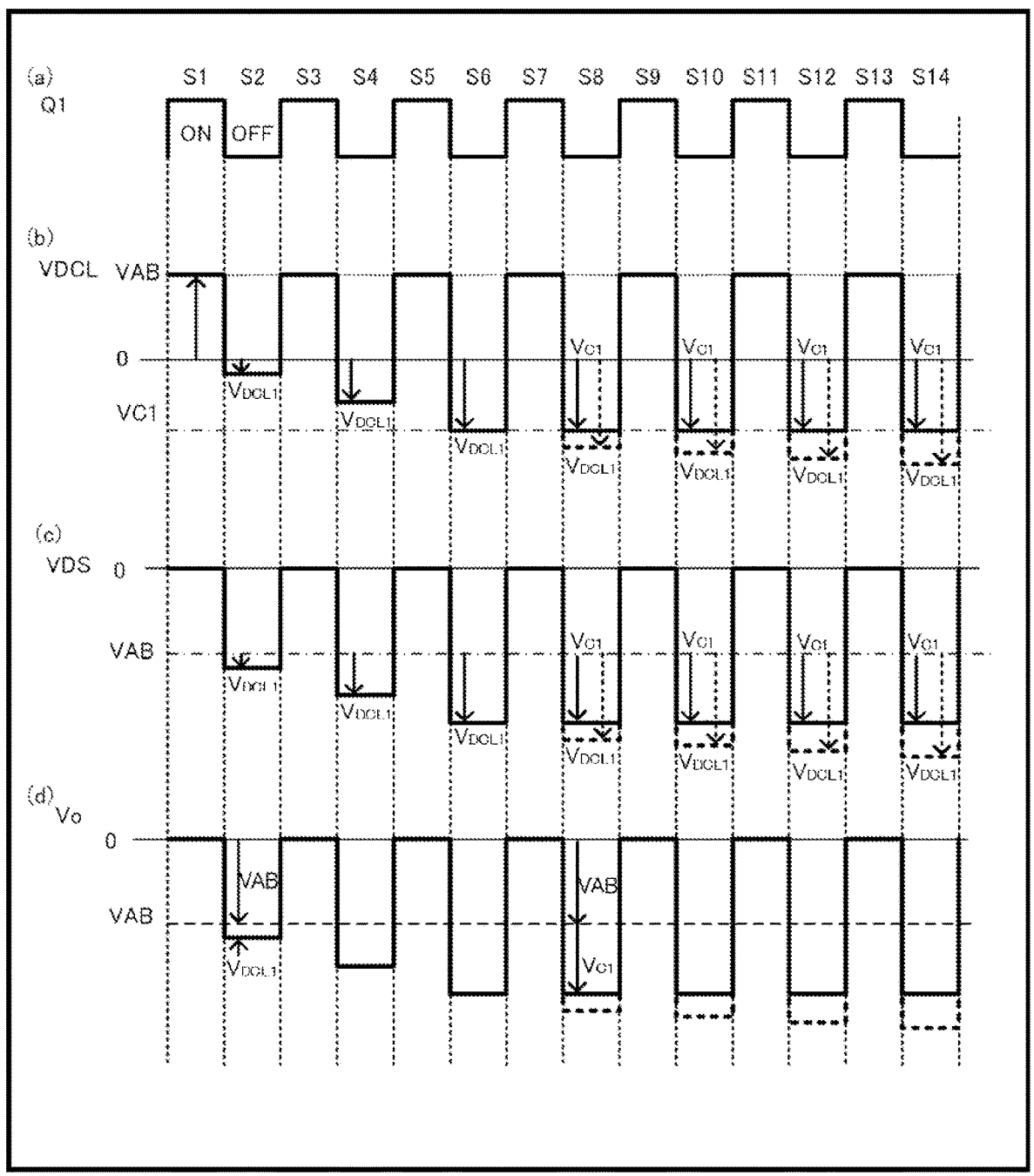
FIG. 3 illustrates a state of a voltage in the first configuration example of the DC pulse power supply device according to the invention.
Figure 4:
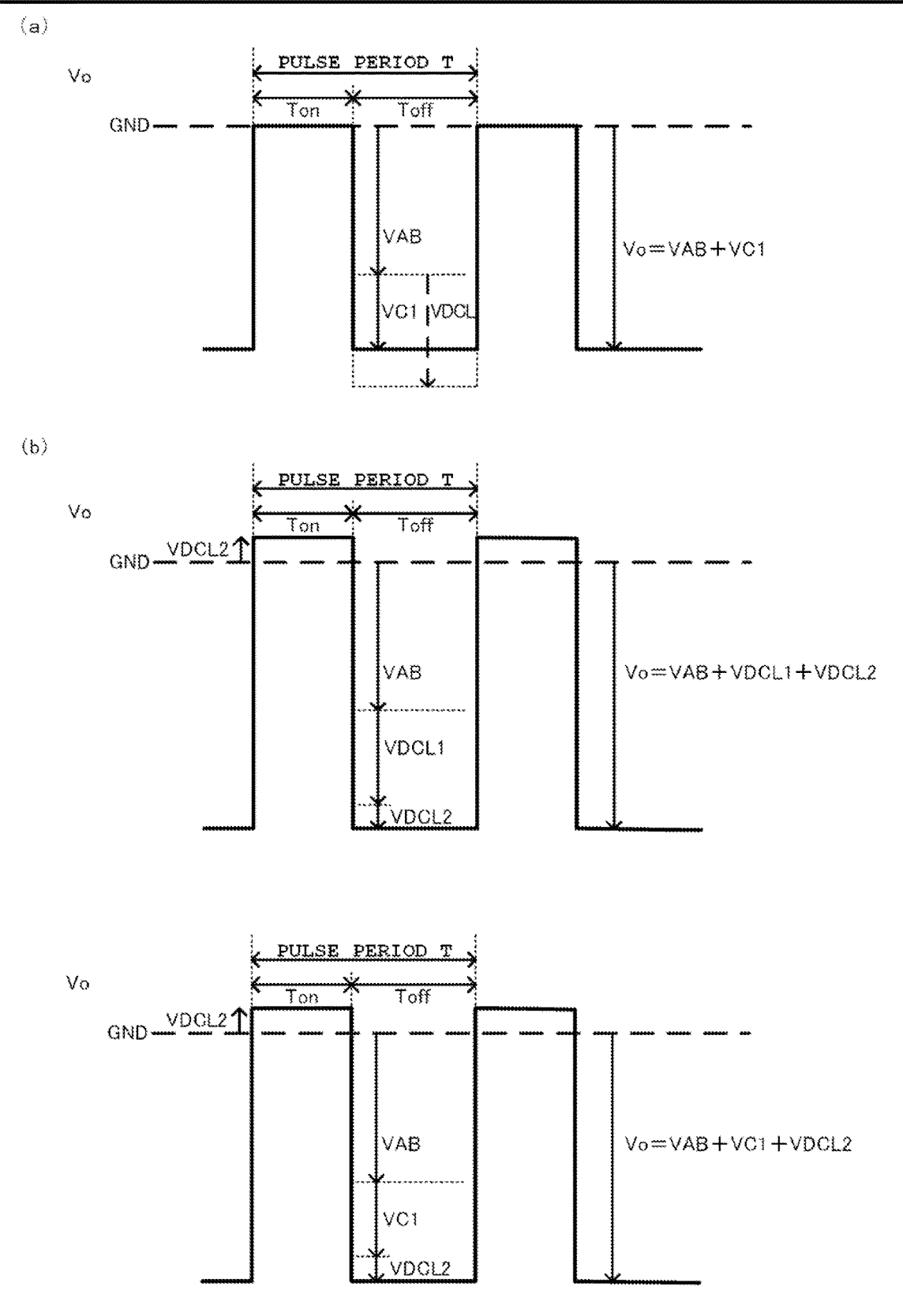
FIG. 4 illustrates an output voltage Vo at the time of pulse outputting in the DC pulse power supply device according to the invention.

The switching element 22 is in the OFF state (FIG. 3(a)), and the reactor voltage VDCL is generated in the DC reactor 21a by the discharge of the accumulated energy. The voltage value of the reactor voltage VDCL increases every time the state changes from ON to OFF. In this voltage rise, the reactor voltage VDCL does not reach the capacitor voltage VC1 of the regeneration unit, so that no regeneration is performed. FIG. 3 shows a state where the voltage value on the negative side increases (FIG. 3(b)).

The drain-source voltage VDS of the switching element 22 is rendered to be a voltage corresponding to the reactor voltage VDCL and increases gradually, but does not reach the capacitor voltage VC1 of the regeneration unit. In here, FIG. 3 shows a state where the voltage value on the negative side increases (FIG. 3(c)). As the output voltage Vo, output is a voltage obtained by superimposing the reactor voltage VDCL on the DC voltage VAB of the DC power supply (FIG. 3(d)).

(ii-2) States of S8, S10, S12, S14

As with the cases of S2, S4, S6, the switching element 22 is in the OFF state (FIG. 3(a)), and the reactor voltage VDCL is generated in the DC reactor 21a by the discharge of the accumulated voltage. In the states of S8, S10, S12 and S14, the voltage value of the reactor voltage VDCL reaches the capacitor voltage VC1, so that the voltage value of the reactor voltage VDCL is clamped to the capacitor voltage VC1 to prevent the voltage from increasing any further. FIG. 3(b) shows a state where the reactor voltage VDCL depicted with a solid line is clamped to the capacitor voltage VC1, and also a case, as a comparative example, where the reactor voltage VDCL depicted with a broken line is not clamped to the capacitor voltage VC1.

The drain-source voltage VDS of the switching element 22 is rendered to be a voltage corresponding to the reactor voltage VDCL, and is held to the voltage of the capacitor voltage VC1 of the regeneration unit. FIG. 3(d) shows a state where the drain-source voltage VDS depicted with a solid line is clamped to the capacitor voltage VC1, and also a case, as a comparative example, where the drain-source voltage VDS depicted with a broken line is not clamped to the capacitor voltage VC1. In here, FIG. 3 shows a state where the voltage value on the negative part increases (FIG. 3(c)).

As the output voltage Vo, output is a voltage obtained by adding the reactor voltage VDCL to the DC voltage VAB of the DC power supply. Since the reactor voltage VDCL is clamped, the output voltage Vo is held to be constant (FIG. 3(d)).

FIG. 4(a) shows a first configuration example, in which the output voltage Vo in a state of regeneration. The DC pulse power supply device outputs a pulse output of the output voltage Vo with a period of switching the step-up chopper circuit as a pulse period T. The pulse output has, during the pulse period T, an ON period Ton in which the switching element is in the ON state and an OFF period Toff in which the switching element is in the OFF state. The value of the output voltage Vo during the ON period Ton corresponds to the drain-source voltage VDS.

By contrast, the output voltage Vo during the OFF period Toff is obtained by superimposing the reactor voltage VDCL on the DC voltage VAB of the DC power supply, namely (VAB+VDCL). However, since the reactor voltage VDCL is clamped to the capacitor voltage VC1, the output voltage stands at (VAB+VC1). As the DC voltage VAB and the capacitor voltage VC1 are constant, the output voltage Vo of the pulse output is held constant.

(Configuration Example of Regeneration Unit)

Figure 5:
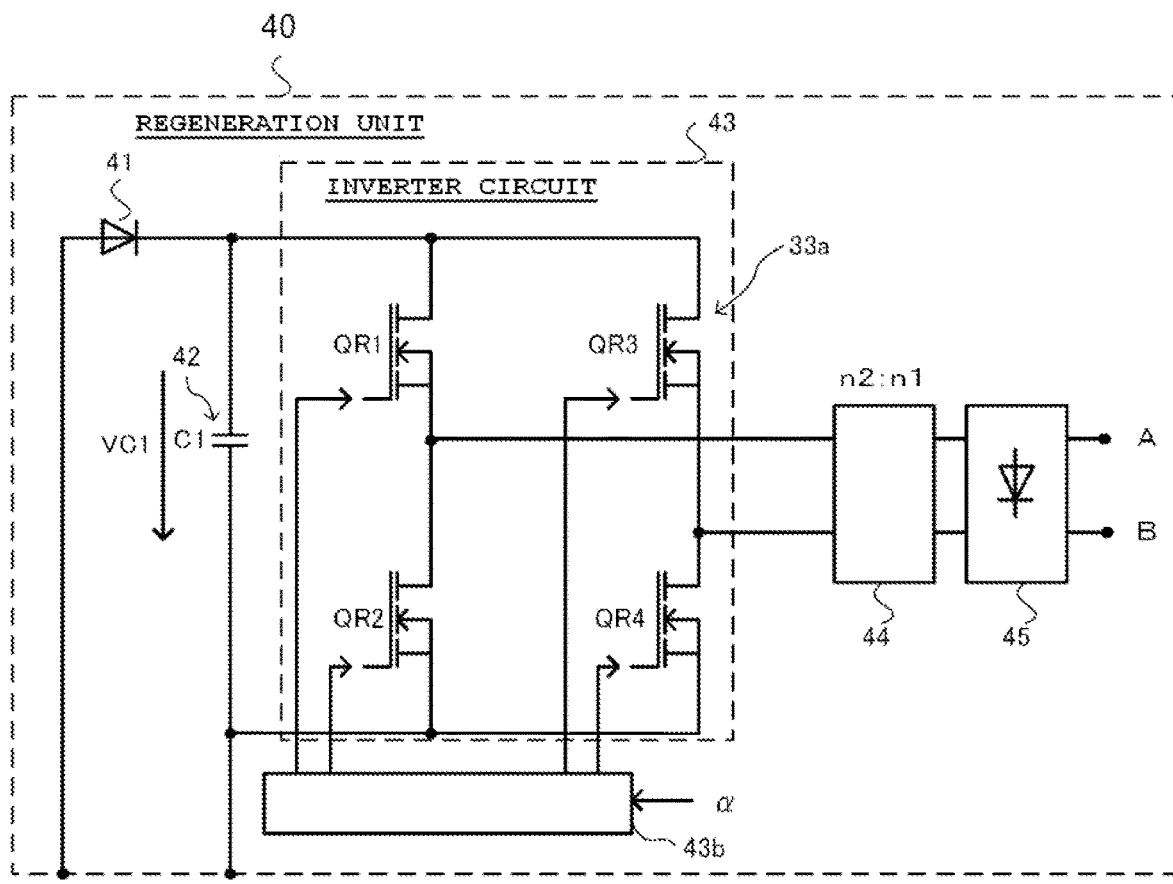
FIG. 5 illustrates a configuration example of a regeneration unit of the DC pulse power supply device according to the invention.

Referring to FIG. 5, a description will be made about the inverter circuit included in the regeneration unit of the DC pulse power supply device.

The regeneration unit 40 includes the inverter circuit 43 that outputs to the transformer 44 an AC voltage obtained by performing orthogonal transformation on the DC voltage of the capacitor voltage VC1 in the capacitor (C1) 42. The inverter circuit 43 comprises a bridge circuit 43a consisting of switching elements QR1 to QR4, and a drive circuit 43b that generates a drive signal for driving the switching elements QR1 to QR4 based on a control signal a. In here, a full-bridge circuit is used as an example of the bridge circuit 43a, but the circuit 43a may be a half-bridge circuit or multi-phase inverter circuit.

(Second Configuration of DC Pulse Power Supply Device)

A second configuration of the DC pulse power supply device of the present invention comprises the DC power supply unit (DC unit) 10, a pulsing unit 20B that supplies to the load 4 with a pulse output generated by the step-up chopper circuit connected to the DC power supply unit 10, the reactor voltage unit 30B arranged in the pulsing unit 20B, and the control circuit 50 that controls the DC power supply unit 10 and the pulsing unit 20B, the power supply device supplying the pulse output through an output cable 3 to the load 4.

Figure 6:
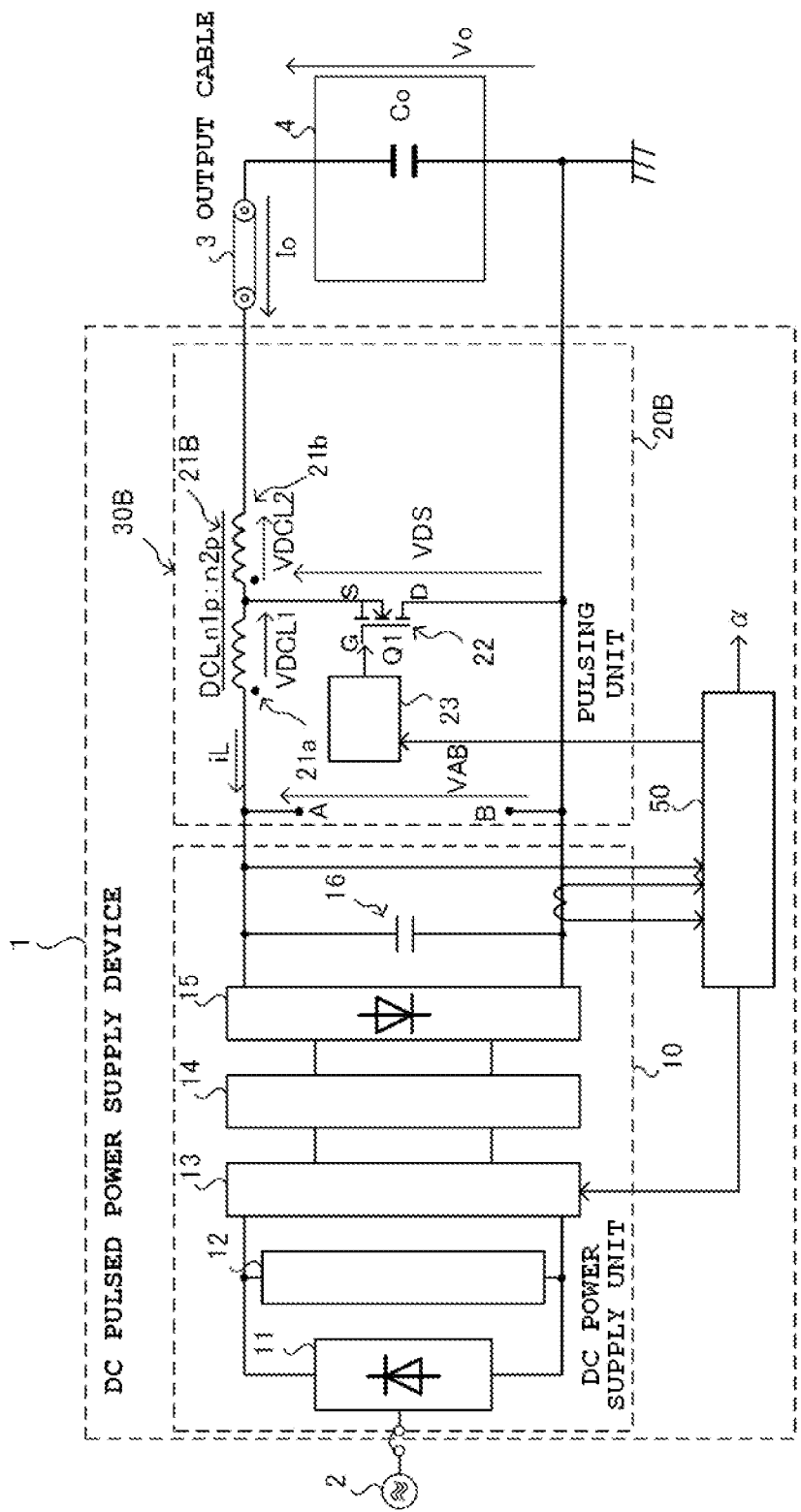
FIG. 6 illustrates a second configuration example of the DC pulse power supply device according to the invention.

The second configuration example of the DC pulse power supply device of the invention will be described by referring to FIG. 6. The second configuration example is different from the first configuration example in having the reactor voltage unit 30B instead of the regeneration voltage unit 30A, and is the same as the first configuration example in the other constituent elements. Next, a description will be made about the constituent element that differs from that of the first configuration example, but the description about the other common elements will be omitted.

The DC reactor 21a constituting the DC reactor 21A included in the step-up chopper circuit of the first configuration example is composed of the non-tapped autotransformer. By contrast, the DC reactor 21B of the second configuration example comprises the second DC reactor 21b magnetically coupled to the DC reactor 21a, and is composed of a tapped autotransformer instead of the non-tapped autotransformer of the step-up chopper circuit of the first configuration example. The DC reactor 21B of the tapped autotransformer is configured such that the magnetically coupled DC reactor 21a and the second DC reactor 21b are connected in series. One end of the DC reactor 21a is connected to the terminal A on the low-voltage side of the DC power supply, and one end of the second DC reactor 21b is connected to the load. The connection point of the DC reactor 21a and the second DC reactor 21b is connected to the source S of the switching element 22.

When the switching element 22 is in the ON state, the tapping point of the DC reactor 21B is grounded, thereby flowing a current from the terminal B to the terminal A via the switching element 22 in the ON state and the DC reactor 21a of the DC reactor 21B. At this time, electromagnetic energy is accumulated in the DC reactor 21a.

Then, when the switching element 22 is turned from the ON state to the OFF state, a reactor current iL flown by the accumulated energy in the DC reactor 21a of the DC reactor 21B causes the generation of a reactor voltage VDCL1 in the DC reactor 21a and a reactor voltage VDCL2 in the second DC reactor 21b. The step-up chopper circuit repeatedly changes the ON state and the OFF state of the switching element 22, so as to boost the output voltage Vo as with the case of the first configuration example.

The voltage ratio between the reactor voltage VDCL1 of the DC reactor 21a and the reactor voltage VDCL2 of the second DC reactor 21b corresponds to an inductance ratio between the DC reactor 21a and the second DC reactor 21b. When a turns ratio of the single-turning coils of the DC reactor 21a and second DC reactor 21b of the DC reactor 21B is n1p:n2p, the voltage ratio (VDCL1/VDCL2) between the reactor voltage VDCL1 of the DC reactor 21a and the reactor voltage VDCL2 of the second DC reactor 21b stands at the turns ratio of (n1p/n2p).

As to the output voltage Vo, output is a voltage (Vo=VAB+VDCL1+VDCL2) which is obtained by superimposing the reactor voltage VDCL1 of the DC reactor 21a and the reactor voltage VDCL2 of the second DC reactor 21b on the DC voltage VAB of the DC power supply. The reactor voltage VDCL2 of the second DC reactor 21b is defined according to the turns ratio (n1p/n2p) of the magnetically coupled DC reactor 21a and second DC reactor 21b, and is expressed as VDCL2=VDCL1×(n2p/n1p). Thus, the output voltage Vo is $$Vo = VAB + VDCL1 + VDCL2$$

$$= VAB + VDCL1 + VDCL1 \times (n2p/n1p)$$

$$= VAB + (1 + (n2p/n1p)) \times VDCL1,$$

and thereby the output voltage of the pulse output can be increased with the turns ratio (n2p/n1p).

FIG. 4(b) shows the output voltage Vo in the second configuration example. The DC pulse power supply device outputs the pulse output of the output voltage Vo with a period of switching the step-up chopper circuit as a pulse period T. The pulse output has, during the pulse period T, an ON period Ton in which the switching element is in the ON state and an OFF period Toff in which the switching element is in the OFF state. The value of the output voltage Vo during the ON period Ton corresponds to the reactor voltage VDCL2.

By contrast, the output voltage Vo during the OFF period Toff is obtained by superimposing the reactor voltage VDCL1 of the DC reactor 21a and the reactor voltage VDCL2 of the second DC reactor 21b on the DC voltage VAB of the DC power supply, namely (VAB+VDCL1+ VDCL2).

(Third Configuration of DC Pulse Power Supply Device)

A third configuration of the DC pulse power supply device of the present invention also comprises the DC power supply unit (DC unit) 10, a pulsing unit 20B that supplies to the load 4 with a pulse output generated by the step-up chopper circuit connected to the DC power supply unit 10, the regeneration voltage unit 30A that applies a superimposed voltage to the DC reactor, a reactor voltage unit 30B arranged in the pulsing unit 20B, and the control circuit 50 that controls the DC power supply unit 10 and the pulsing unit 20B, the power supply device supplying the pulse output through the output cable 3 to the load 4.

Figure 7:
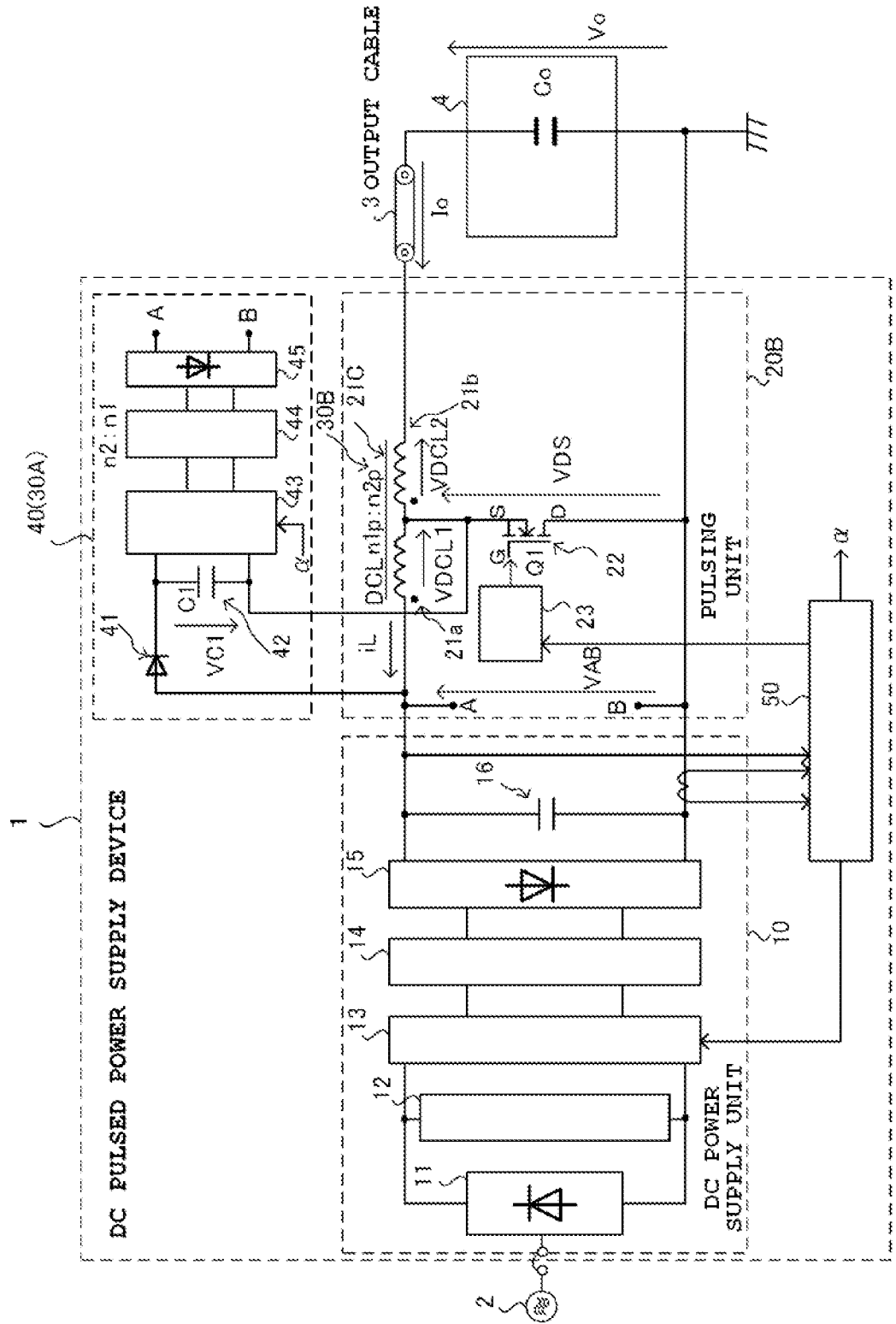
FIG. 7 illustrates a third configuration example of the DC pulse power supply device according to the invention.

A description will now be made about the third configuration example of the DC pulse power supply device of the invention by referring to FIG. 7. The third configuration example is different from the first and second configuration examples in the regeneration voltage unit 30A and the reactor voltage unit 30B, and is the same as the first and second configuration examples in the other constituent elements. Next, a description will be made about the regeneration voltage unit 30A and the reactor voltage unit 30B, and the description about the other common elements will be omitted. The third configuration example includes the regeneration voltage unit 30A and the reactor voltage unit 30B as voltage superimposing unit.

(Regeneration Voltage Unit 30A)

The regeneration voltage unit 30A is composed of a regeneration unit, as with the first configuration example. FIG. 7 shows a configuration example having the regeneration unit 40 as the regeneration voltage unit 30A.

The regeneration unit 40 regenerates to the DC power supply a component of the reactor voltage in the DC reactor of the step-up chopper circuit that exceeds a set voltage, and also functions as the regeneration voltage unit 30A for applying the reactor voltage VDCL1 of the DC reactor 21a to the capacitor voltage VC1 for the set voltage during pulse outputting. The regeneration unit 40 comprises the diode 41, the capacitor (C1) 42, the inverter circuit 43, the transformer 44 and the rectifier 45.

One end of the capacitor (C1) 42 is connected to an end of the load side of the DC reactor 21a and the other end is connected to an end of the DC power supply side of the DC reactor 21a via the diode 41, thereby applying a reactor voltage generated in the DC reactor 21a. The voltage VC1 in the capacitor (C1) 42 is defined based on the DC voltage VAB of the DC power supply and a transformer ratio of the transformer, and thus when the transformer ratio of the transformer 44 is (n2:n1), the voltage VC1 becomes a set voltage of VC1=(n2/n1)×VAB. The diode 41 is connected such that a direction from the pulse unit 20A toward the capacitor (C1) 42 of the regeneration unit 40 is a forward direction, and when the reactor voltage VDCL in the DC reactor 21a exceeds the capacitor voltage VC1 in the capacitor (C1) 42, the regeneration unit 40 regenerates a component of the reactor voltage VDCL exceeding the capacitor voltage VC1 in the capacitor (C1) 42.

In this way, the regeneration unit 40 performs a regeneration operation by using the capacitor voltage VC1 in the capacitor (C1) 42 as threshold, as well as acting as a constant-voltage supply for applying the reactor voltage VCL1 in the DC reactor 21a to the capacitor voltage VC1 during the pulse outputting. The output voltage Vo of the pulse output stands at a value (VAB+VC1+VDCL2) obtained by superimposing the capacitor voltage VC1 and the DC reactor voltage VDCL2 on the DC voltage VAB of the DC power supply. The capacitor voltage VC1 corresponds to the regeneration input voltage Vin shown in FIG. 1.

The capacitor voltage VC1 is set to a value of (n2/n1)× VAB, so that the output voltage Vo of the pulse output becomes a voltage (VAB+(n2/n1)×VAB) obtained by superimposing the voltage (n2/n1)×AB on the DC voltage VAB in the DC power supply. The voltage (n2/n1)×VAB can be changed by varying the transformer ratio (n2:n1) of the transformer 44, and thus the output voltage Vo of the pulse output can be boosted by varying the transformer ratio (n2:n1) of the transformer 44.

(Reactor Voltage Unit 30B)

The reactor voltage unit 30B has the configuration similar to that of the second configuration example, and is composed of a tapped autotransformer.

The reactor voltage unit 30B is composed of a DC reactor 21C comprising the second DC reactor 21b magnetically coupled to the DC reactor 21a, the DC rector 21a and the second DC reactor 21b being formed of a tapped autotransformer. The DC reactor 21C of the tapped autotransformer is configured such that the magnetically coupled DC reactor 21a and second DC reactor 21b are connected in series. One end of the DC reactor 21a is connected to the terminal A on the low-voltage side of the DC power supply, one end of the second DC reactor 21b is connected to the load, and a connection point between the DC reactor 21a and the second DC reactor 21b is connected to the source S of the switching element 22.

When the switching element 22 is in the ON state, a tapping point of the DC reactor 21C is grounded, so that a current flows from the terminal B to the terminal A via the switching element 22 in the ON state and the DC reactor 21a of the DC reactor 21B. At this time, electromagnetic energy is accumulated in the DC reactor 21a.

Then, when the switching element 22 is turned from the ON state to the OFF state, a reactor current iL flown by the accumulated energy in the DC reactor 21a of the DC reactor 21C causes the generation of the reactor voltage VDCL1 in the DC reactor 21a, while causing the generation of the reactor voltage VDCL2 in the second DC reactor 21b. The step-up chopper circuit repeatedly changes the ON state and the OFF state of the switching element 22, so as to boost the output voltage Vo.

A voltage ratio between the reactor voltage VDCL1 of the DC reactor 21a and the reactor voltage VDCL2 of the second DC reactor 21b stands at a value corresponding to an inductance ratio between the DC reactor 21a and the second DC reactor 21b. When a turns ratio of the tapped autotransformer of the DC reactor 21a and second DC reactor 21b of the DC reactor 21C is n1p:n2p, the voltage ratio (VDCL1/VDCL2) between the reactor voltage VDCL1 of the DC reactor 21a and the reactor voltage VDCL2 of the second DC reactor 21b stands at the turns ratio of (n2p/n1p).

The output voltage Vo becomes a voltage (Vo=VAB+ VDCL1+VDCL2) obtained by superimposing the reactor voltage VDCL1 in the DC reactor 21a obtained by the regeneration voltage unit 30A and the reactor voltage VDCL2 in the second DC reactor 21b obtained by the reactor voltage unit 30B on the DC voltage VAB.

The reactor voltage VDCL1 in the DC reactor 21a is clamped to the constant voltage of the capacitor voltage VC1 by the regeneration voltage unit 30A, and in the case where the regeneration voltage unit 30A is composed of the regeneration unit, the capacitor voltage VC1 is set to VC1=(n2/n1)×VAB based on the transformer ratio of the transformer. The reactor voltage VDCL2 in the second DC reactor 21b is set on the basis of the turns ratio (n2p/n1p) of the magnetically coupled DC reactor 21a and second DC reactor 21b, i.e. expressed by VDCL2=VDCL1×(n2p/n1p).

In this way, the regeneration voltage unit 30A and the reactor voltage unit 30B provide the output voltage Vo expressed as below.

$$Vo = VAB + VDCL1 + VDCL2$$
$$= VAB + VC1 + VC1 \times (n2p/n1p)$$
$$= VAB + (1 + (n2p/n1p)) \times VC1$$
$$= VAB + (1 + (n2p/n1p)) \times (n2/n1) \times VAB$$
$$= VAB[1 + \{1 + (n2p/n1p)\} \times (n2/n1)]$$

The step-up chopper circuit performs the ON/OFF operation of the switching element at the duty ratio Duty to boost the DC voltage VAB in the DC power supply, thereby generating a pulse output with a voltage value of (VAB/(1−Duty)). The above-mentioned output voltage Vo goes into the following two output states due to the relationship between the pulse output voltage (VAB/(1−Duty)) in the step-up chopper circuit and the capacitor voltage VC1 in the capacitor C1 of the regeneration unit.

(1) In the case where the voltage (VAB/(1−Duty)) in the step-up chopper circuit is larger than the capacitor voltage VC1 in the capacitor C1 of the regeneration unit:

the voltage state corresponds to the case of VAB/(1−Duty) ≥VC1(=(n2/n1)×VAB), and thus the output voltage Vo is expressed by $$Vo=VAB+VC1+VDCL2=VAB+VC1+(n2p/n1p)\times VC1.$$

In this case, the capacitor voltage VC1 is expressed by VC1=(n2/n1)×VAB, and thus two voltage rises generated by the transformer ratio (n2/n1) of the transformer and the turns ratio (n2p/n1p) of a DC reactor DCL to boost the output voltage Vo.

(2) In the case where the voltage (VAB/(1−Duty)) in the step-up chopper circuit does not reach the capacitor voltage VC1 in the capacitor C1 of the regeneration unit:

the voltage state corresponds to the case of VAB/(1−Duty) <VC1(=(n2/n1)×VAB), and thus the output voltage Vo is expressed by $$Vo=VAB/(1-Duty)+(n2p/n1p)\times Duty\times VAB/(1-Duty).$$

In this case, the voltage boosted based on the turns ratio (n2p/n1p) of the DC reactor DCL can boost the output voltage Vo.

In this way, the output voltage Vo of the pulse output can be boosted by the transformer ratio (n2/n1) of the transformer of the regeneration unit and the turns ratio (n2p/n1p) between the DC reactor 21a and the second DC reactor 21b.

FIG. 4(c) shows the output voltage Vo in the regeneration state in the third configuration example. The DC pulse power supply device outputs the pulse output of the output voltage Vo with a period of switching the step-up chopper circuit as a pulse period T. The pulse output has, during the pulse period T, an ON period Ton in which the switching element is in the ON state and an OFF period Toff in which the switching element is in the OFF state. The value of the output voltage Vo during the ON period Ton corresponds to the reactor voltage VDCL2.

By contrast, the output voltage Vo in the OFF period Toff is a voltage (VAB+VC1+VDCL2) that is obtained by superimposing the capacitor voltage VC1 and the reactor voltage VDCL2 of the second DC reactor 21b on the DC voltage VAB of the DC power supply.

(Fourth Configuration of DC Pulse Power Supply Device)

A fourth configuration of the DC pulse power supply device of the present invention comprises, as with the third configuration, the DC power supply unit (DC unit) 10, the pulsing unit 20C that generates a pulse output by using the step-up chopper circuit connected to the DC power supply unit 10 so as to supply the generated pulse output to the load 4, and the control circuit 50 that controls the DC power supply unit 10, the pulsing unit 20C and the regeneration unit 40, and further comprising the regeneration voltage unit 30A and the reactor voltage unit 30B as voltage superimposing unit, the power supply device supplying the pulse output through the output cable 3 to the load 4.

Figure 8:
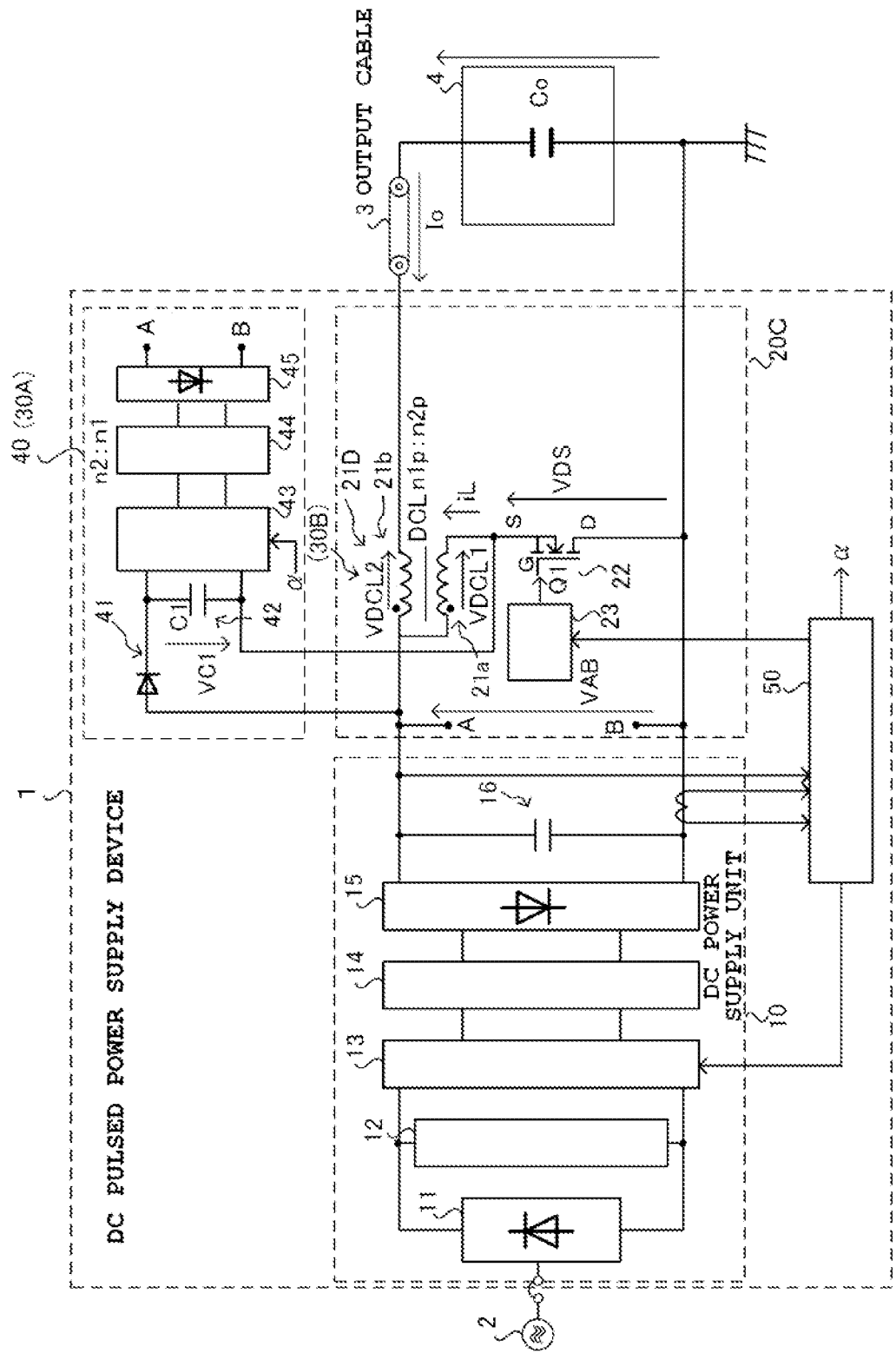
FIG. 8 illustrates a fourth configuration example of the DC pulse power supply device according to the invention.
Figure 9:
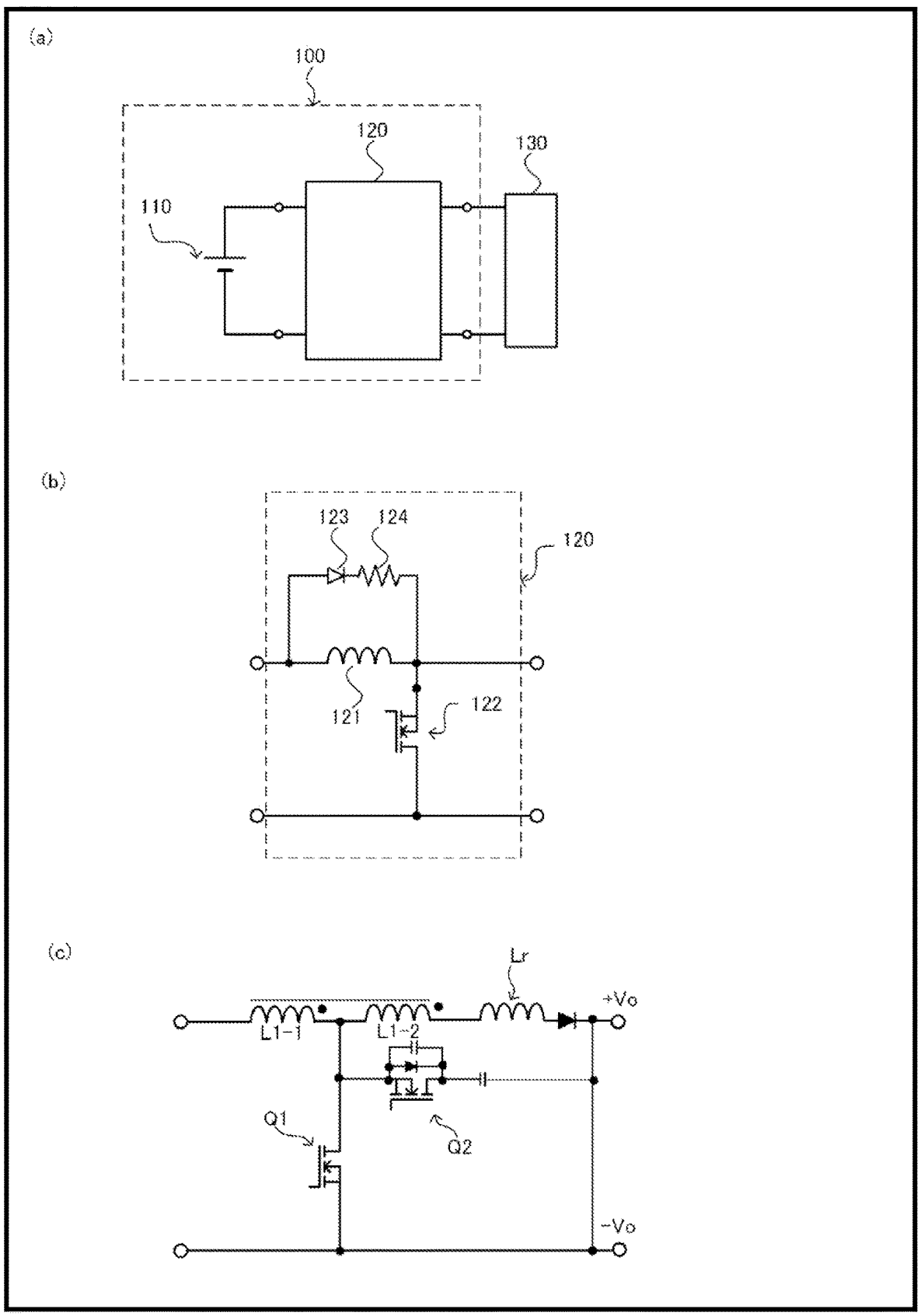
FIG. 9 illustrates configuration examples of a conventional DC pulse power supply device and a conventional step-up chopper circuit.

A description will now be made about the fourth configuration example of the DC pulse power supply device of the invention by referring to FIG. 8. The fourth configuration example is different from the third configuration example in the reactor voltage unit 30B, and is the same as the first and second configuration examples in the other constituent elements. Next, a description will be made about the constituent element that differs from that of the third configuration example, and the description about the other common elements will be omitted.

The DC reactor 21C constituting the reactor voltage unit 30B of the third configuration example is composed of the tapped autotransformer. By contrast, the DC reactor 21D constituting the reactor voltage unit 30B of the fourth configuration example is composed of a multi-winding transformer instead of the tapped autotransformer of the step-up chopper circuit of the third configuration example.

The DC reactor 21D of the multi-winding transformer is configured by connecting the magnetically coupled DC reactor 21a and second DC reactor 21b in parallel. One end of the DC reactor 21a is connected to the terminal A on the low-voltage side of the DC power supply, and the other end thereof is connected to the source S of the switching element 22. One end of the second DC reactor 21b is connected to the terminal A on the low-voltage side of the DC power supply, and the other end is connected to the load side.

When the switching element 22 is in the ON state, the end of the switching element 22 of the DC reactor 21a of the DC reactor 21D is grounded, so that a current flows from the terminal B to the terminal A through the switching element 22 in the ON state and the DC reactor 21a. At this time, electromagnetic energy is accumulated in the DC reactor 21a.

Then, when the switching element 22 is turned from the ON state to the OFF state, a reactor current iL flown by the accumulated energy in the DC reactor 21a of the DC reactor 21D causes the generation of the reactor voltage VDCL1 in the DC reactor 21a, and the electromagnetic coupling of the second DC reactor 21b with the DC reactor 21a causes the generation of the reactor voltage VDCL2 in the second DC reactor 21b. The step-up chopper circuit repeatedly changes the ON state and the OFF state of the switching element 22, thereby boosting the output voltage Vo as with the case of the first and second configuration examples.

A voltage ratio between the reactor voltage VDCL1 of the DC reactor 21a and the reactor voltage VDCL2 of the second DC reactor 21b stands at a value corresponding to an inductance ratio between the DC reactor 21a and the second DC reactor 21b. When a turns ratio of the multi-turning coils of the DC reactor 21a and second DC reactor 21b of the DC reactor 21D is (n1p:n2p), the voltage ratio (VDCL1/VDCL2) between the reactor voltage VDCL1 of the DC reactor 21a and the reactor voltage VDCL2 of the second DC reactor 21b stands at the turns ratio of (n1p/n2p).

As to the output voltage Vo, output is a voltage (Vo=VAB+VDCL2) obtained by superimposing the reactor voltage VDCL2 in the second DC reactor 21b on the DC voltage VAB in the DC power supply, and the output voltage Vo of the pulse output is expressed as below, as with the second configuration example.

$$Vo = VAB + VDCL2$$
$$= VAB + VC1 \times (n2p/n1p)$$
$$= VAB + (n2p/n1p) \times VC1$$
$$= VAB + (n2p/n1p) \times (n2/n1) \times VAB$$
$$= VAB\{1 + (n2p/n1p)\} \times (n2/n1)\}$$

The description about the above embodiments and modifications are examples of the DC pulse power supply device in accordance with the present invention. The present invention is therefore not limited to the above embodiments and can be changed or modified in various ways on the basis of the ideas of the invention, and these variations are not excluded from the scope of the invention.

INDUSTRIAL APPLICABILITY

The DC pulsed power supply device of the present invention can be applied as power source for supplying electric power to a plasma generation device, and furthermore can be used as power supply device for supplying a pulse output to a load of a pulse laser-excitation system, electrical discharge machine or similar.

REFERENCE SIGNS LIST

1 DC Pulse Power Supply Device
2 AC Power Supply
3 Output Cable
4 Load
10 DC Power Supply Unit
11 Rectifier
12 Snubber Circuit
13 Single-Phase Inverter Circuit
14 Single-Phase Transformer
15 Rectifier
16 Capacitor
20,20A,20B,20C,20D Pulsing Unit
21,21A,21B,21C,21D,21a DC Reactor
21b Second DC Reactor
22 Switching Element
30 Voltage Superimposing Unit
30A Regeneration Voltage Unit
30B Reactor Voltage Unit
40 Regeneration Unit
41 Diode
42 Capacitor
43 Inverter Circuit
43a Bridge Circuit
43b Drive Circuit
44 Transformer
45 Rectifier
50 Control Circuit
100 DC Pulse Power Supply Device
110 DC Power Supply
120 Step-Up Chopper Circuit
121 Inductor
122 Switching Element
123 Diode
124 Resistor
QR1-QR4 Switching Element

The invention claimed is:

1. A DC pulse power supply device comprising a DC power supply and a pulsing unit that uses a step-up chopper circuit connected to the DC power supply to generate a pulse output, further comprises
a voltage superimposing unit connected to a DC reactor of the step-up chopper circuit, the voltage superimposing unit superimposing a superimposed voltage on the pulse output,
wherein the voltage superimposing unit is
connected between both ends of the DC reactor of the step-up chopper circuit, and
a regeneration voltage unit consisting of a regeneration unit for regenerating to the DC power supply a component of the reactor voltage in the DC reactor that exceeds a set voltage,
the superimposed voltage being the set voltage of the regeneration unit.

2. The DC pulse power supply device according to claim 1, wherein the regeneration unit comprises:
a capacitor connected in parallel with respect to the reactor voltage of the pulsing unit;
an inverter circuit that performs orthogonal transformation on a capacitor voltage of the capacitor;
a transformer that transforms an AC voltage in the inverter circuit; and
a rectifier that rectifies an AC voltage in the transformer,
the regeneration unit uses the set voltage as a voltage across the capacitor to regenerate a component of voltage exceeding the voltage across the capacitor to the DC power supply, and
varies the superimposed voltage based on a transformer ratio of the transformer.

3. The DC pulse power supply device according to claim 1, wherein the regeneration unit has its one end connected to an input end on a low-voltage side of the pulsing unit, and uses a reactor voltage in the DC reactor that refers to the voltage on the low-voltage side as a regeneration input voltage.

4. The DC pulse power supply device according to claim 2, wherein the regeneration unit has its one end connected to an input end on a low-voltage side of the pulsing unit, and uses a reactor voltage in the DC reactor that refers to the voltage on the low-voltage side as a regeneration input voltage.

5. A DC pulse power supply device comprising a DC power supply and a pulsing unit that uses a step-up chopper circuit connected to the DC power supply to generate a pulse output, further comprises
a voltage superimposing unit connected to a DC reactor of the step-up chopper circuit, the voltage superimposing unit superimposing a superimposed voltage on the pulse output,
wherein the DC reactor has a second DC reactor magnetically coupled thereto, the voltage superimposing unit is a reactor voltage unit composed of the second DC reactor, the superimposed voltage being a voltage of the second DC reactor.

6. The DC pulse power supply device according to claim 5, wherein one end of the DC reactor is connected to an output end of the DC power supply, a connection point between the DC reactor and the second DC reactor is connected to a source of a switching element of the step-up chopper circuit, the superimposed voltage is varied depending on a turns ratio of the DC reactor and the second DC reactor.

7. The DC pulse power supply device according to claim 5, wherein the DC reactor and the second DC reactor are composed of a tapped autotransformer or a multi-winding transformer.

8. The DC pulse power supply device according to claim 6, wherein the DC reactor and the second DC reactor are composed of a tapped autotransformer or a multi-winding transformer.

9. A DC pulse power supply device comprising a DC power supply and a pulsing unit that uses a step-up chopper circuit connected to the DC power supply to generate a pulse output, further comprises a voltage superimposing unit connected to a DC reactor of the step-up chopper circuit, the voltage superimposing unit superimposing a superimposed voltage on the pulse output, wherein the voltage superimposing unit comprises:

a regeneration voltage unit composed of a regeneration unit connected between both ends of the DC reactor of the step-up chopper circuit to regenerate to the DC power supply a component of a reactor voltage of the DC reactor which exceeds a set voltage; and a reactor voltage unit composed of the second DC reactor magnetically coupled to the DC reactor, the superimposed voltage being a set voltage of the regeneration unit included in the regeneration voltage unit as well as a voltage of the second DC reactor included in the reactor voltage unit.

10. The DC pulse power supply unit according to claim 9, wherein the regeneration unit has its one end connected to an input end on a low-voltage side of the pulsing unit, and uses a reactor voltage in the DC reactor that refers to the voltage on the low-voltage side as a regeneration input voltage.

11. The DC pulse power supply device according to claim 9, wherein the DC reactor and the second DC reactor are composed of a tapped autotransformer or a multi-winding transformer.

\* \* \* \* \*